United States Patent
Robinson et al.

(10) Patent No.: US 7,315,220 B1
(45) Date of Patent: Jan. 1, 2008

(54) VOLTAGE CONTROLLED OSCILLATOR

(75) Inventors: Moises E. Robinson, Austin, TX (US);
Shahriar Rokhsaz, Austin, TX (US);
Marwan M. Hassoun, Davis, CA (US);
Earl E. Swartzlander, Jr., Austin, TX (US)

(73) Assignee: Xilinx, Inc., San Jose, CA (US)

( * ) Notice: Subject to any disclaimer, the term of this patent is extended or adjusted under 35 U.S.C. 154(b) by 67 days.

(21) Appl. No.: 11/340,998

(22) Filed: Jan. 27, 2006

(51) Int. Cl.
*H03B 5/20* (2006.01)

(52) U.S. Cl. .................. 331/100; 331/57; 331/114; 331/108 B; 331/135; 331/177 R (58) Field of Classification Search ........... 331/57, 331/100, 108 R, 114, 108 B, 135, 177 R; 327/280, 281, 270, 287
See application file for complete search history.

(56) References Cited

U.S. PATENT DOCUMENTS

| | | | |
|---|---|---|---|
| 6,252,434 B1 * | 6/2001 | Nag et al. ............ | 327/65 |
| 6,396,358 B1 * | 5/2002 | Poss et al. ............ | 331/57 |
| 2005/0195643 A1 * | 9/2005 | Holger ................ | 365/154 |
| 2006/0091967 A1 * | 5/2006 | Iozsef et al. .......... | 331/57 |
| 2006/0214739 A1 * | 9/2006 | Kang ................. | 331/57 |

OTHER PUBLICATIONS

Ali Hajimiri and Thomas H. Lee; "A General Theory of Phase Noise in Electrical Oscillators"; IEEE Journal of Solid-State Circuits; Copyright IEEE; Feb. 1998; vol. 33, No. 2; pp. 179-194.

Behzad Razavi; "A 2-GHz 1.6-mW Phase-Locked Loop"; May 1997; Copyright IEEE; IEEE Journal of Solid-State Circuits; vol. 32, No. 5; pp. 730-735.

Liang Dai and Ramesh Harjani; "A Low-Phase-Noise CMOS Ring Oscillator with Differential Control and Quadrature Outputs"; Copyright 2001; IEEE Proceedings of 14th Annual International ASIC/SOC Conference; pp. 134-138.

William Shing Yak and Howard Cam Luong; "A 900-MHz CMOS Low-Phase-Noise Voltage-Controlled Ring Oscillator"; Feb. 2001; Copyright 2001 IEEE; IEEE Transactions on Circuits and Systems-II: Analog and Digital Signal Processing; Feb. 2001; vol. 48, No. 2; pp. 216-221.

Dean A. Badillo and Sayfe Kiaei; "A Low Phase Noise 2.0V 900MHz CMOS Voltage Controlled Ring Oscillator"; ISCAS 2004; Copyright 2004 IEEE; vol. IV; pp. 533-536.

(Continued)

*Primary Examiner*—Benny Lee
*Assistant Examiner*—Ryan J Johnson
(74) *Attorney, Agent, or Firm*—Kim Kanzaki; Michael R. Hardaway (57) ABSTRACT

A voltage controlled oscillator (VCO) having a single stage ring-oscillator having both coarse and fine control of the frequency of oscillation is described. In an embodiment the VCO may include a first n-channel latch having a first output and a second output; a first P-channel transistor coupled between a voltage supply and a first VCO output, where a gate of the first P-channel transistor is coupled to the first output of the first n-channel latch; a first programmable resistor circuit coupled between the first VCO output and the first output of the first n-channel latch; and a second n-channel latch coupled to the first VCO output.

18 Claims, 10 Drawing Sheets

OTHER PUBLICATIONS

W. H. Tu et al.; "A 1.8V 2.5-5.2 GHz CMOS Dual-Input Two-Stage Ring VCO"; Aug. 4-5, 2004; 2004 IEEE AP-ASIC; pp. 134-137.

Daniel P. Bautista and Monico Linares Aranda; "A Low Power and High Speed CMOS Voltage-Controlled Ring Oscillator"; Copyright 2004 IEEE; ISCAS 2004; vol. IV; pp. 752-755.

Seema Butala Anand and Behzad Razavi; "A CMOS Clock Recovery Circuit for 2.5-Gb/s NRZ Data"; Mar. 2001; Copyright 2001 IEEE; IEEE Journal of Solid-State Circuits; Mar. 2001; vol. 36, No. 3; pp. 432-439.

A. Ahmed et al.; "CMOS VCO-Prescaler Cell-Based Design for RF PLL Frequency Synthesizers"; May 2000; Copyright 2000 IEEE; ISCAS 2000—IEEE International Symposium on Circuits and Systems; May 28-31, 2000; vol. II; pp. 737-740.

A. Hajimiri and T. H. Lee; "Low Noise Oscillator"; 1999; The Netherlands: Kluwer Academic Publishers Group; pp. 17-29.

\* cited by examiner

VOLTAGE CONTROLLED OSCILLATOR

FIELD OF THE INVENTION

The present invention relates generally to voltage controlled oscillators (VCOs) and more specifically, to a single stage VCO.

BACKGROUND

One type of voltage controlled oscillator may conventionally include a ring oscillator, which may have a number of inverting gain stages in a ring. Because the phase noise of the ring oscillator decreases as the output oscillation amplitude increases, a rail-to-rail output signal swing and fast switching (e.g., fast rise and fall times) are desirable in order to improve the noise performance of the oscillator.

From a power consumption point of view, it is desirable to minimize the number of stages in a ring oscillator. If the number of stages in the ring oscillator is decreased by a factor of 2, the oscillator can oscillate at twice the frequency because the total delay around the loop is half as much. Also, the oscillator will dissipate half the amount of power. Therefore it is very appealing to consider ring oscillators with the minimum number of required delay elements.

Figure 1:
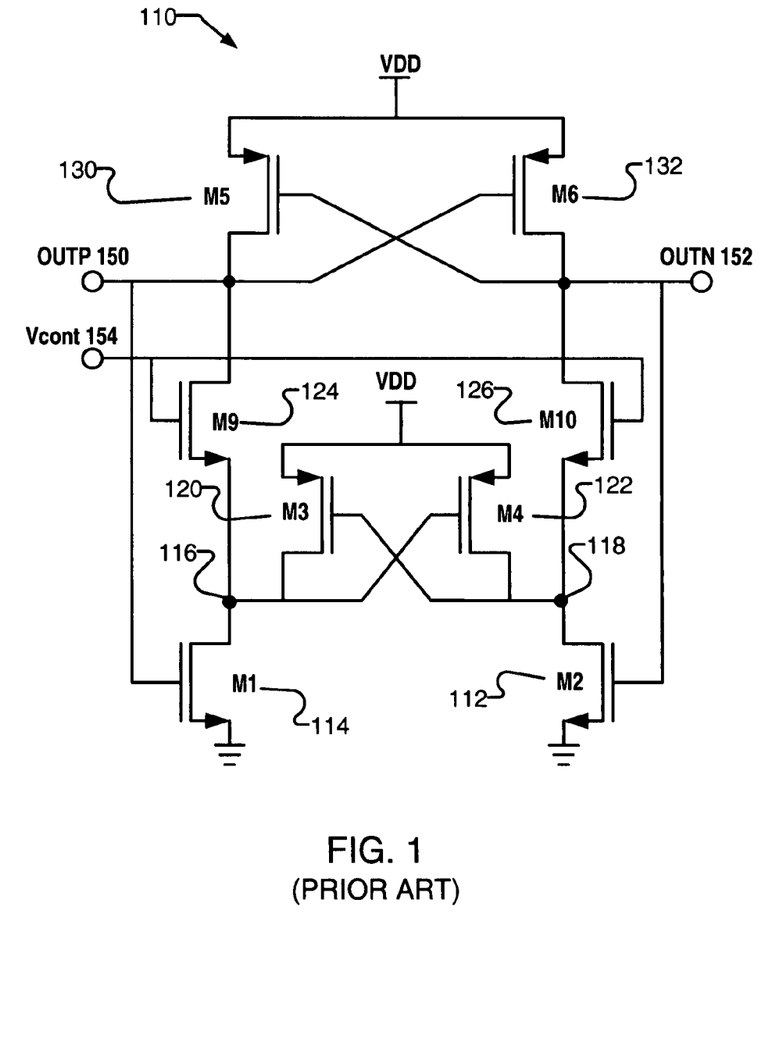
FIG. 1 is a schematic of a VCO having a single stage ring oscillator of the prior art.

FIG. 1 is a schematic of a VCO 110 having a single stage ring oscillator of the prior art. The VCO 110 is described in a paper by A. Ahmed, K. Sharaf, H. Haddara, H. G. Ragai, entitled "CMOS VCO-prescaler cell-based design for RF PLL Frequency Synthesizers," ISCAS 2000, Vol. II, pp. 737-740, May 2000, which is herein incorporated by reference.

For a simplified explanation of the operation of FIG. 1 without any voltage control, let Vcont 154 be high enough so that the resistances in transistors M9 and M10 are low. Also let OUTP 150 be 1 and OUTN 152 be 0 initially. Hence, P transistor M5 130 is on and P transistor M6 132 is off. N transistor M1 114 is on and N transistor M2 112 is off. Node 116 is pulled toward ground, hence P transistor M4 122 is turned on, pulling node 118 to VDD and turning of P transistor M3 120. Also as OUTP 150 is pulled toward ground, P transistor M6 132 is turned on and P transistor M5 130 is turned off. Thus OUTN 152 transitions from 0 to 1. Thus, now OUTP 150 is 0 and OUTN 152 is 1. When OUTN 152 is 1, N transistor M2 112 turns on and OUTN 152 is pulled toward ground. As illustrated the VCO 110 oscillates between VDD and ground.

Another way of looking at FIG. 1 is that the cross-coupled p-channel transistors M3 and M4 provide a first 90 degree phase shift and the cross-coupled p-channel transistors M5 and M6 provide a second 90 degree phase shift. The n-channel transistors M1 and M2 provide the 180 degree phase shift.

To control the frequency of the VCO 110, a single-ended control voltage (Vcont 154) is applied to the gates of transistors M9 124 and M1 0126. Transistors M9 and M10 act as voltage-controlled resistors between nodes OUTP 150 and node 116 and between OUTN 152 and node 118, respectively. As the control voltage Vcont 154 decreases, M9 and M10 will be delayed in switching ON and will have a higher equivalent resistance, resulting in VCO 110 having a lower frequency of oscillation.

The VCO of FIG. 1 has several major disadvantages. First, VCO 110 may not oscillate if the control signal Vcont 154 is too low because transistors M9 and M10 would be an open circuit. Second, the VCO 110 may also fail to oscillate if the signal Vcont 154 is very high and the effective resistance of transistors M9 and M10 is less than the minimum resistance required to sustain oscillation. This lack of VCO oscillation is a potential problem when the VCO is used in a closed loop PLL application, as the phase frequency detector will not have anything to compare against the reference clock frequency.

Therefore, there is need for an improved VCO having a single stage oscillator.

SUMMARY

The present invention relates generally to a voltage controlled oscillator having a single stage ring-oscillator. In an exemplary embodiment of the present invention the single stage ring-oscillator has both coarse and fine control of the frequency of oscillation of the ring-oscillator.

An embodiment of the present invention includes a voltage controlled oscillator (VCO). The VCO comprises: a first n-channel latch having a first output and a second output; a first P-channel transistor coupled between a voltage supply and a first VCO output, wherein a gate of the first P-channel transistor is coupled to the first output of the first n-channel latch; a first programmable resistor circuit coupled between the first VCO output and the first output of the first n-channel latch; and a second n-channel latch coupled to the first VCO output. The VCO can further include a second P-channel transistor coupled between the voltage supply and a second VCO output, wherein a gate of the second P-channel transistor is coupled to the second output of the first n-channel latch; and a second programmable resistor circuit coupled between the second VCO output and the second output of the first n-channel latch.

Another embodiment of the present invention includes a voltage controlled oscillator having: a first latch coupled to a voltage supply and having a first VCO output and a second VCO output; a first programmable resistor circuit coupled between the first VCO output and a first node, the first programmable resistor circuit receiving a digital control input having one or more bits for coarse setting of a VCO frequency and an analog control input for fine setting of the VCO frequency; a first transistor coupled between the first node and ground, wherein a gate of the first transistor is coupled to the first VCO output; and a second latch coupled to the supply voltage and to the first node. In one aspect the analog control input is a differential signal and the first programmable resistor circuit comprises: a plurality of binary weighted transmissions gates coupled in parallel with a first resistor and controlled by the one or more bits for coarse setting; and a plurality of transistors coupled in parallel with the first resistor and controlled by the differential signal.

Yet another embodiment of the present invention includes a single stage voltage controlled oscillator. The VCO includes transistor means for providing a 180 degree phase shift, where the transistor means is coupled to a voltage reference (ground or VDD); a first latch means for providing a first 90 degrees phase shift; a second latch means for providing a second 90 degrees phase shift; and a first programmable resistor means for setting a resistance based on a coarse digital setting and a fine analog setting, where the first programmable resistor means is coupled between the first latch and the second latch and further coupled to the transistor means.

The present invention will be more fully understood in view of the following description and drawings.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention.

Figure 2:
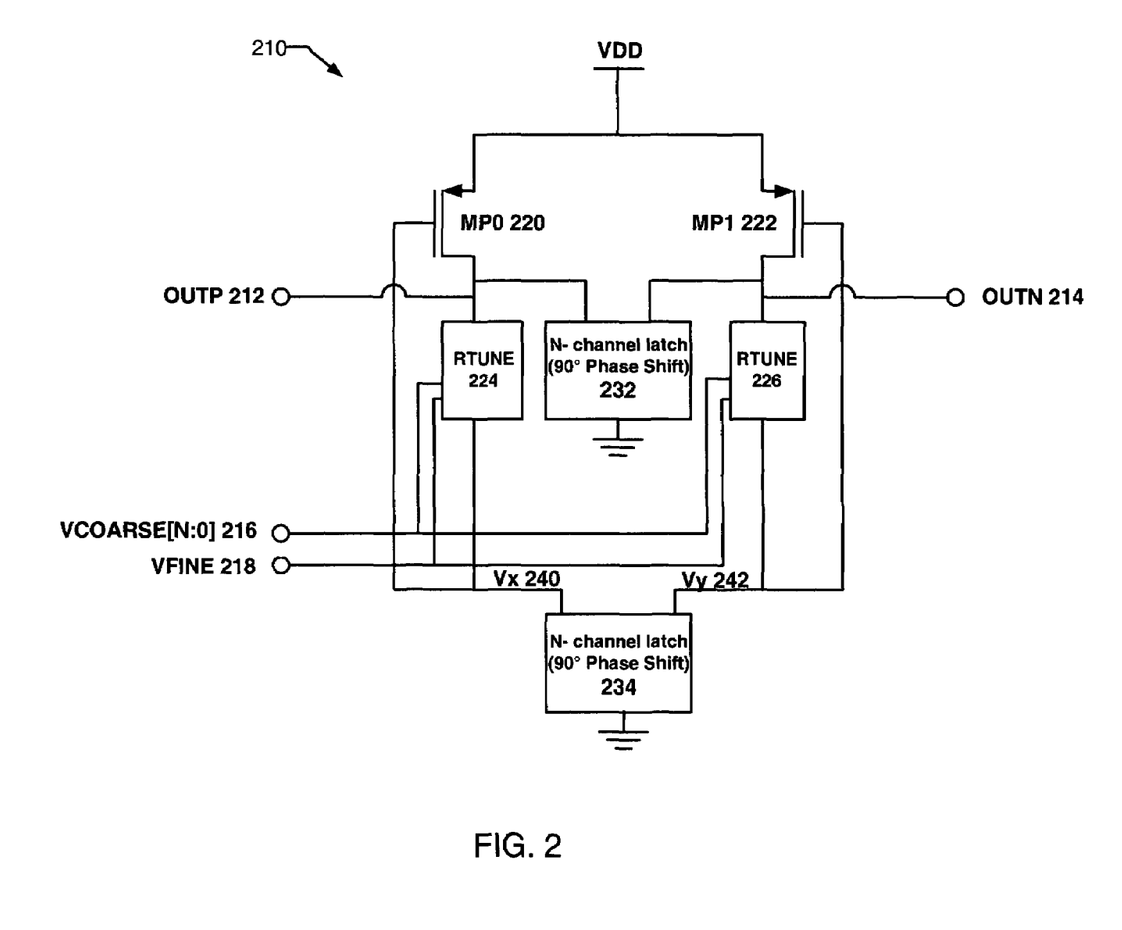
FIG. 2 is a block diagram of the VCO of an embodiment of the present invention.

FIG. 2 is a block diagram of the VCO 210 of an embodiment of the present invention. VCO 210 is a single stage ring oscillator having both coarse and fine frequency tuning controls (216 and 218). A p-channel transistor MP0 220 is coupled to VDD and the VCO 210 positive output OUTP 212. The gate of MP0 220 is connected to Vx 240, which is an output from n-channel latch 234. The n-channel latch 234 is configured to provide a 90 degrees phase shift. MP0 220 is also coupled to a second n-channel latch 232, which is configured to provide another 90 degrees phase shift and to a programmable resistor circuit RTUNE 224, which provides an adjustable amount of equivalent resistance. A p-channel transistor MP1 222 is coupled to VDD and the VCO 210 negative output OUTN 214. The transistors MP0 220 and MP1 222 provide the 180 degrees of phase shift. The gate of MP1 222 is connected to Vy 242, which is another output from n-channel latch 234. MP1 222 is also coupled to the second n-channel latch 232 and to a second programmable resistor circuit RTUNE 226, which also provides an adjustable amount of equivalent resistance. Both RTUNE 224 and RTUNE 226 receive a first voltage control input VCOARSE[N:0], which has N signal lines, and a second analog voltage control input VFINE 218, which has one signal line. N is a positive integer. VCOARSE[N:0] is for a coarse adjustment of the resistance in RTUNE 224 and 226 and VFINE is for fine adjustment of the resistance in RTUNE 224 and 226.

There are several significant differences between FIG. 2 of an embodiment of the present invention and FIG. 1 of the prior art. First the two p-channel latches in FIG. 1 are replaced by n-channel latches in order to minimize the number of p-channel transistors in the design, thus making the overall design less sensitive to Negative Bias Temperature Instability effects (NBTI). NBTI increases the transistor threshold voltage and reduces the transistor saturation current over long periods of time. NBTI typically affects p-channel devices only, especially in sub 130 nm processes. Each of the n-channel latches 232 and 234 provides 90 degree of phase shift for a total of 180 degrees. This plus the 180 degrees from transistors MP0 and MP1 provide the 360 degree phase shift required for oscillation.

Figure 6:
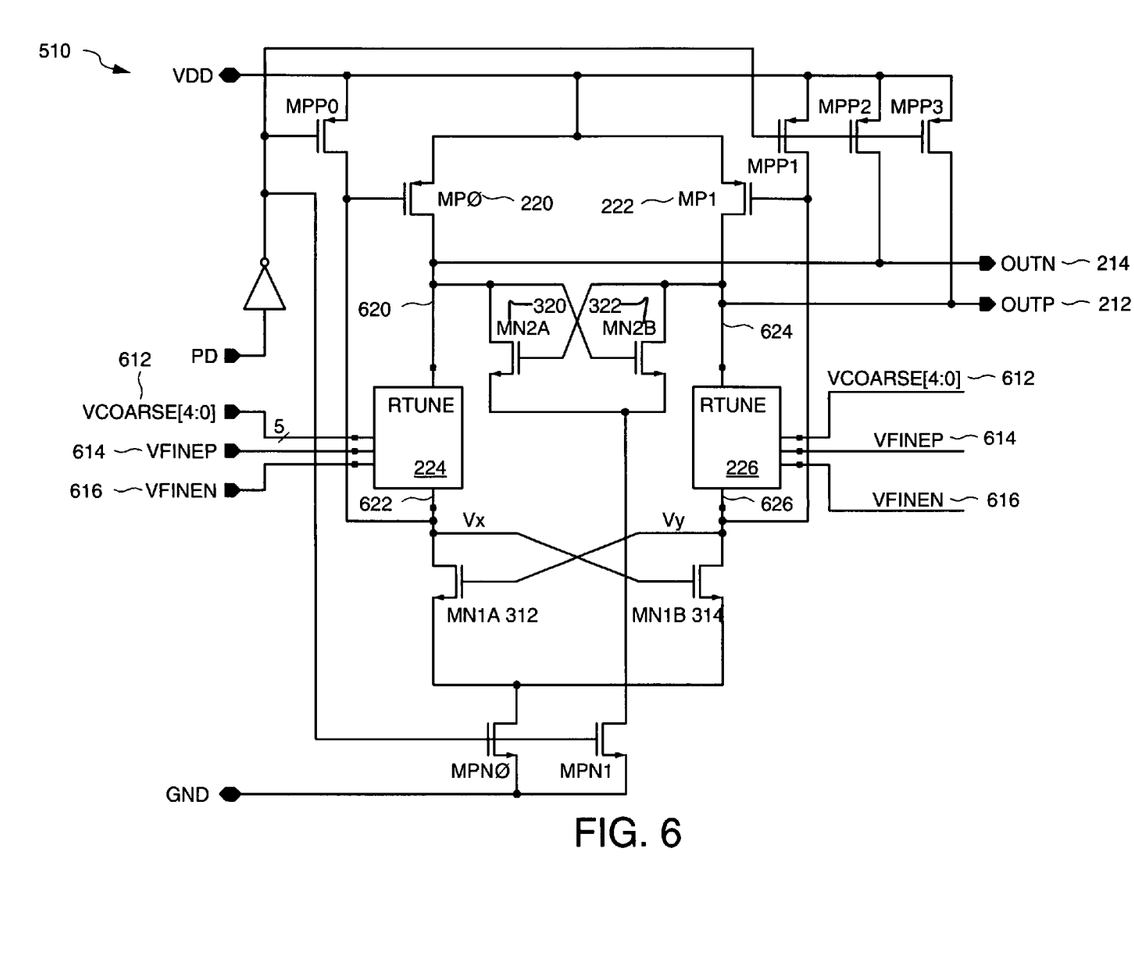
FIG. 6 is schematic of a VCO of an aspect of the present invention.

Second, the frequency of oscillation of the VCO in FIG. 1 is controlled by a single analog control signal Vcont 154 through transistors M9 and M10 (acting as programmable resistors). Both transistors M9 and M10 are replaced by multiple transmission gates to allow for coarse (digital) and fine (analog) frequency tuning, and two resistors to set the minimum and maximum oscillation frequency. These components are inside the blocks labeled RTUNE 224 and 226 in FIG. 2. Also in one embodiment VCO 210 can have differential signals to control the frequency of oscillation (VFINEP/VFINEN) as shown in FIG. 6, compared to the single-ended input signal Vcont 154 shown in FIG. 1.

Figure 3:
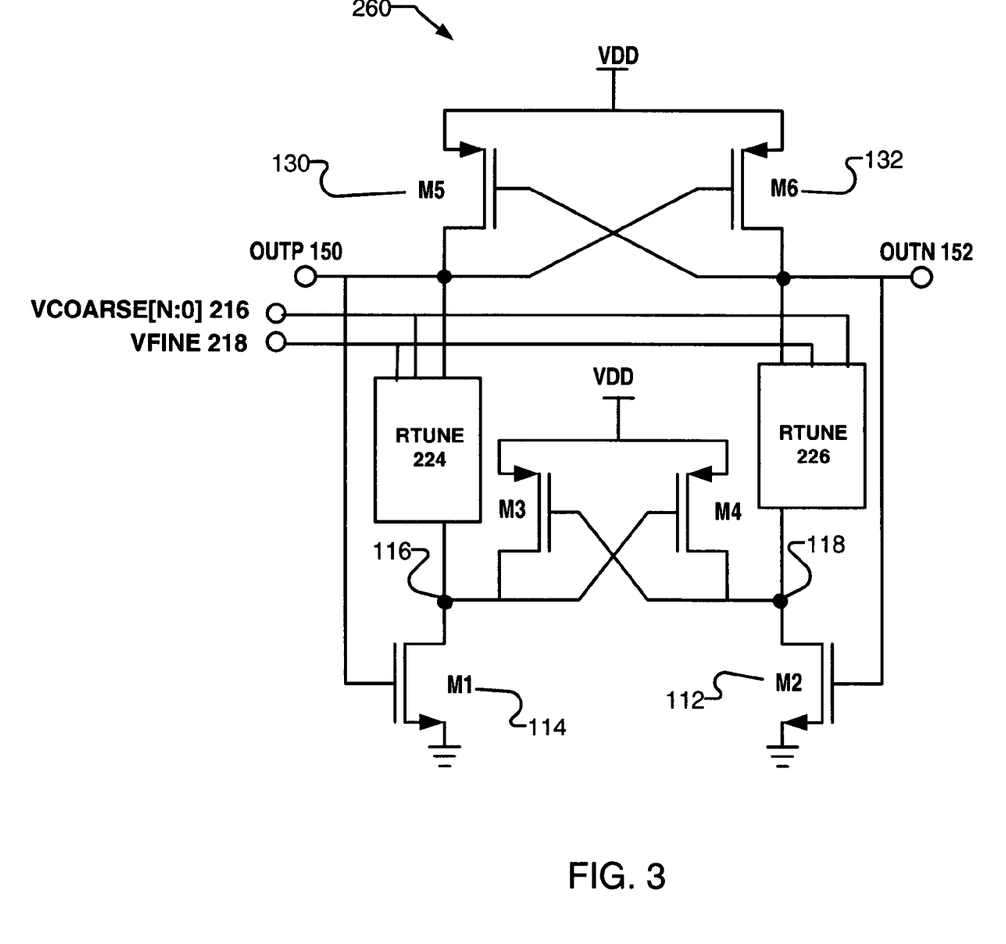
FIG. 3 is a block diagram of the VCO of another embodiment of the present invention.

FIG. 3 is a block diagram of the VCO 260 of another embodiment of the present invention. FIG. 3 is similar to FIG. 1, except the transistors M9 124 and M10 126 have been replaced by RTUNE 224 and 226 (collectively RTUNE), respectively. As will be seen later in FIG. 7, RTUNE has a maximum and minimum resistance. The minimum resistance is set to a first predetermined value to insure oscillation. VCO 260 thus does not have the disadvantage where Vcont 154 in FIG. 1 could be very high and reduce the resistance of circuit M9 and M10 below that needed to sustain oscillation of VCO 110. Also with a second predetermined value for the maximum resistance of RTUNE, unlike FIG. 1, Vcont cannot get so low that it opens M9 and M10 and stops oscillation of VCO 110. VFINE 218 in an alternative embodiment is an analog differential signal such as VFINEP/VFINEN in FIG. 7.

Figure 4:
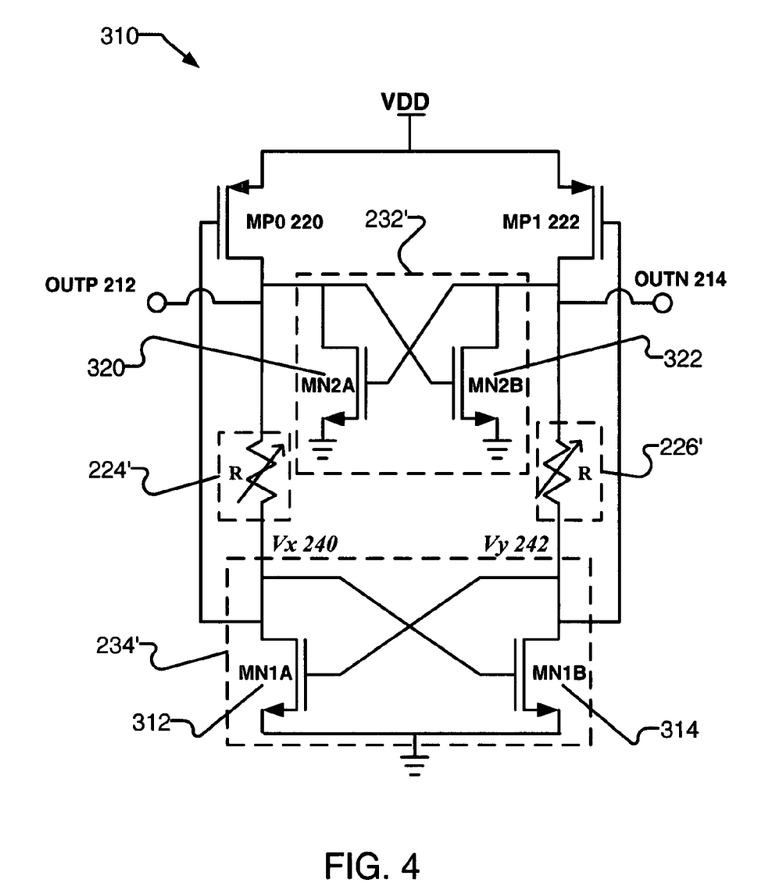
FIG. 4 is a block diagram of the VCO of another embodiment of the present invention.

FIG. 4 is a block diagram of the VCO 310 of another embodiment of the present invention. VCO 310 is one example of an implementation of VCO 210 of FIG. 2. The RTUNE blocks represented by the dashed blocks 224' and 226' include variable resistors R. Variable resistor 224' is coupled to OUTP 212 and Vx 240. Variable resistor 226' is coupled to OUTN 214 and Vy 242. The dotted block 232' showing an example implementation of n-channel latch 232 in FIG. 2, includes two cross coupled n-channel transistors MN2A 320 and MN2B 322. The gate of n-channel transistor MN2A 320 is coupled to OUTN 214 and the gate of n-channel transistor MN2B 322 is coupled to OUTP 212. The drain of MN2A is coupled to the gate of MN2B and the source is coupled to ground. The drain of MN2B is coupled to the gate of MN2A and the source is coupled to ground. The dotted block 234' showing an example implementation of n-channel latch 234 in FIG. 2, includes another two cross coupled n-channel transistors MN1A 312 and MN1B 314. The gate of n-channel transistor MN1A 312 is coupled to Vy 242, which in turn is coupled to variable resistor 226', and the gate of n-channel transistor MN1B 314 is coupled to Vx 240, which in turn is coupled to variable resistor 224'. The drain of MN1A is coupled to the gate of MN1B and the source is coupled to ground. The drain of MN1B is coupled to the gate of MN1A and the source is coupled to ground.

A simplified explanation of the operation of VCO 310, assumes initially, OUTP 212 is 1 or VDD and OUTN 214 is 0 or ground. Hence MN2B 322 is on. After a delay adjusted by R 224', MN1B 314 turns on. This means Vy 242 is pulled to ground, turning p-channel transistor MP1 222 on, and thus pulling OUTN 214 to VDD or 1. MN2A 320 turns on and OUTP 212 goes to 0. After a delay adjusted by R 226', MN1A turns on pulling Vx 240 to ground and turning on p-channel transistor MP0 220. Thus OUTP 212 goes to 1. So far OUTP 212 has gone from 1 to 0 to 1 and OUTN has gone from 0 to 1. When OUTP is 1 as seen from above OUTN will go to 0 and the process continues to produce an oscillation on OUTN 212 and an inverted oscillation on OUTN 214. Also as seen from the above explanation, the frequency of oscillation is a function of the adjustable resistances R in blocks 224' and 226'.

Figure 5:
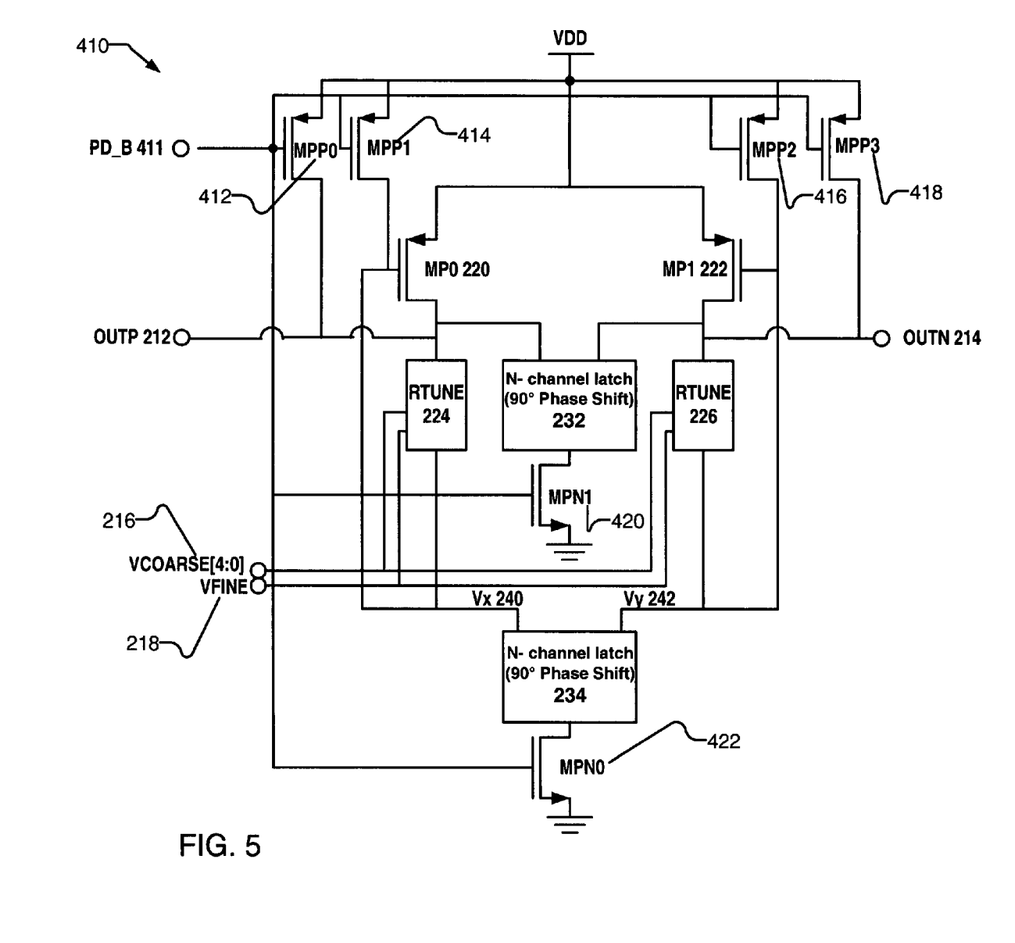
FIG. 5 is a block diagram of a VCO of yet another embodiment of the present invention.

FIG. 5 is a block diagram of a VCO 410 of yet another embodiment of the present invention. FIG. 5 has similar circuits as in FIG. 2, except four p-channel transistors: MPP0 412, MPP1 414, MPP2 416, and MPP3 418, and two n-channel transistors: MPN1 420 and MPN0 422, have been added to handle the power down of VCO 410 via inverted power down signal PD_B (PD bar). PD_B 411 is coupled to the gates of MPP0 412, MPP1 414, MPP2 416, MPP3 418, MPN1 420 and MPN0 422. Transistors MPP0, MPP1, MPP2 and MPP3 pull up to VDD the output nodes OUTP 212 and OUTN 214 and internal nodes (VX 240 and VY 242) during power down (PD_B=0), and this provides that the gate to source and gate to bulk voltage for the p-channel devices MP0 220 and MP1 222 are zero during power down. This helps to reduce NBTI effects to devices MP0 and MP1 during the power down state. Power down n-channel transistors MPN0 422 and MPN1 420 are used to cut off the DC path to ground for the n-channel latches 234 and 232, respectively, so that the output nodes OUTP 212 and OUTN 214 could be pulled up without DC current flow during power down.

FIG. 6 is a schematic of a VCO 510 of an aspect of the present invention. FIG. 6 is a more detailed description of FIG. 5. The programmable resistor blocks RTUNE 224 and 226 both receive a five bit coarse control VCOARSE[4:0] 612 and a differential analog fine control: VFINEP 614 (positive) and VFINEN 616 (negative). RTUNE 224 is coupled to MP0 220 via signal line 620 and to MN1A 312 via signal line 622. RTUNE 226 is coupled to MP1 222 via signal line 624 and to MN1B 314 via signal line 626.

Figure 7:
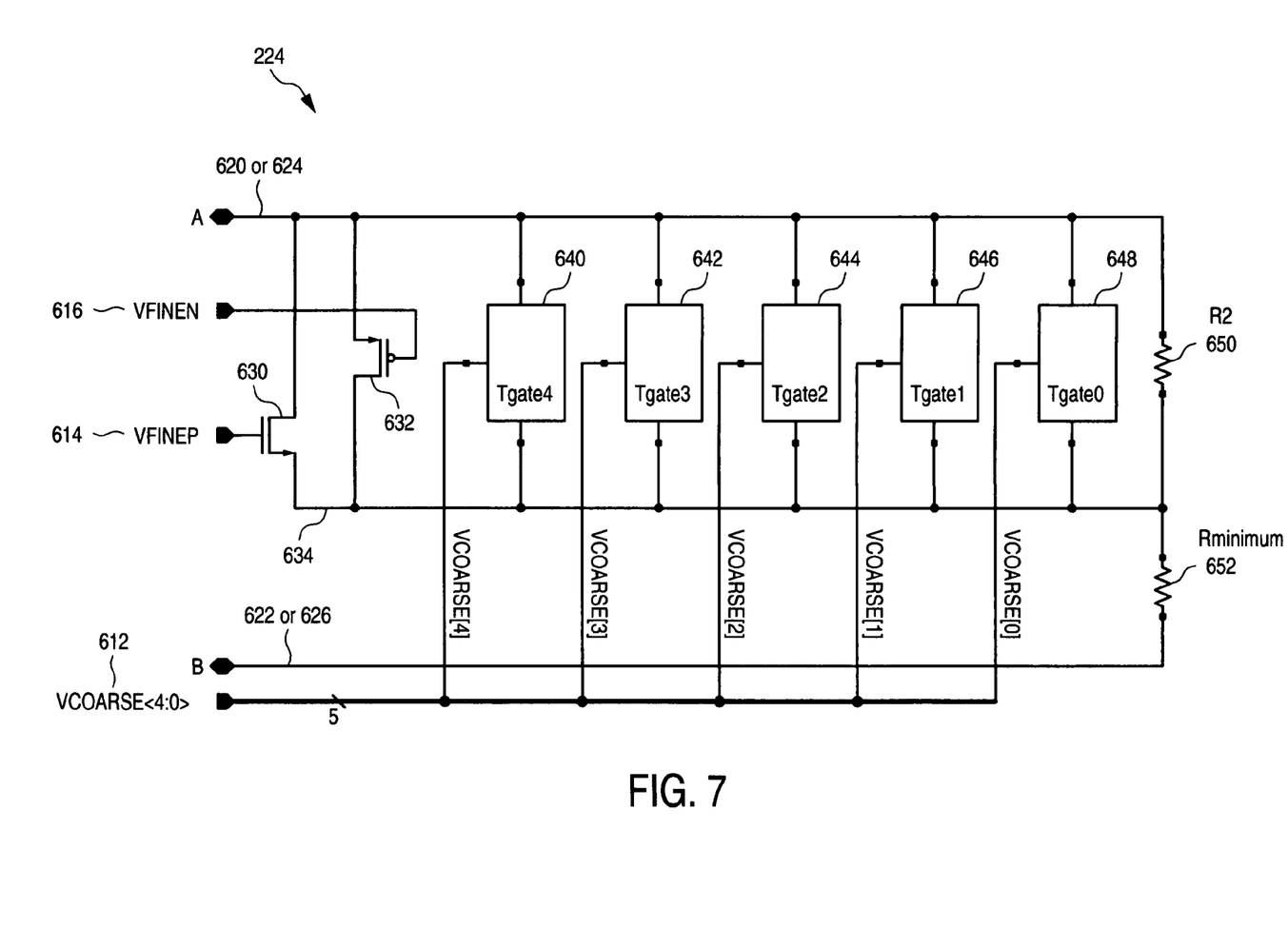
FIG. 7 shows a schematic of the programmable resistor (RTUNE block) that is used to control the frequency of oscillation of an embodiment of the present invention.

FIG. 7 shows a schematic of the programmable resistor (RTUNE block, e.g. 224 or 226) that is used to control the frequency of oscillation of the VCO 510 of an embodiment of the present invention. As RTUNE 224 and RTUNE 226 are similar, only RTUNE 224 will be discussed in more detail. The digital input word VCOARSE[4:0] 612 is used as a coarse digital frequency calibration, and a differential analog control voltage (VFINEP/VFINEN) is used as the fine analog control. VFINEN 616 is connected to the gate of p-channel transistor 632 and VFINEP 614 is connected to the gate of n-channel transistor 630. Transistors 630 and 632 are coupled in parallel between signal line 620 and signal line 634. The resistance of transistors 630 and 632 provide a finely adjustable resistance.

VCOARSE[4:0] 612 selectively places binary weighted transmission gates, Tgate4 640 controlled by VCOARSE[4], Tgate3 642 controlled by VCOARSE[3], Tgate2 644 controlled by VCOARSE[2], Tgate1 646 controlled by VCOARSE[1] and Tgate0 648 controlled by VCOARSE[0], in parallel with the variable resistor R2 650 (i.e., the transmission gates are coupled between signal line 620 and signal line 634). The equivalent resistance of the transmission gate TGATE4 640 controlled by VCOARSE[4] is 16 times smaller than that of the transmission gate controlled by VCOARSE[0] (the width of the devices in Tgate4 are 16 times that of the width of the devices in Tgate0).

For illustration purposes only, let R2 be a resistor of 1000 ohms. The Tgate0 through Tgate4 resistances may be Tgate0=1000 ohms, Tgate1=500 ohms, Tgate2=250 ohms, Tgate3=125 ohms, and Tgate4=62.5 ohms. Hence if all the Tgates are OFF, the resistance is 1000 ohms plus Rminimum. If Tgate0 is ON and the rest of the Tgates are OFF, then there are two 1000 ohms resistors in parallel, so the resistance is 500 ohms plus Rminimum. If Tgate0 and Tgate1 are ON, then with the R2 1000 resistor, in parallel with the Tgate0 (1000 ohms) and the Tgate1 (500 ohms), the total resistance is 250 ohms plus Rminimum, and so on. Regarding sizes, the width of the pmos and nmos devices in the Tgate1 will be 2 times the size of that in Tgate0; Tgate2 will be 2 times the size of Tgate1, and so on. When the size is doubled, the resistance is cut in half.

The purpose of VCOARSE[4:0] in FIG. 7 is to first do a coarse setting of the resistance for a desired frequency of oscillation. Then the differential analog control voltage VFINEP/VFINEN can be used to do the fine adjustment since the digital adjustment circuit is limited by the quantization error. This two step, digital then analog, adjustment is significantly superior to an analog only adjustment, as the analog circuit would need a very large adjustment range.

Rminimum 652 is a fixed resistor whose value is chosen to be larger than the minimum resistance required for the VCO 510 to oscillate. Rminimum 652 is connected in series with R2 650 and is coupled between signals lines 634 and 622. In one embodiment the maximum resistance of RTUNE 224 is about R2 plus Rminimum and the minimum resistance is close to Rminimum. For the embodiment of VCO 510 of FIG. 6, Rminimum can have values on the order of 50 to 5K ohms and R2 on the order of 500 to 20K ohms. In other embodiments Rminimum and/or R2 can have other resistance values as known to one of ordinary skill in the arts.

In another embodiment resistance R2 650 in FIG. 7 may be replaced by a Tgate of similar resistance where the gate of the n-channel transistor is connected to VDD, and the gate of the p-channel transistor is connected to ground. Similarly, resistor Rminimum 652 would be replaced by another Tgate of similar resistance where the gate of the n-channel transistor is connected to VDD and the gate of the p-channel transistor is connected to VSS.

In yet another embodiment of FIG. 7 transistors 630 and 632 rather than being connected between nodes 620 (624) and node 634 are connected between nodes A 620 (624) and B 622 (626). The circuit may have a more constant gain for different values of coarse tuning because the analog transmission gate (630 and 632) is connected across the whole resistance (R2+Rminimum) as opposed to only across the resistance R2.

Figure 8:
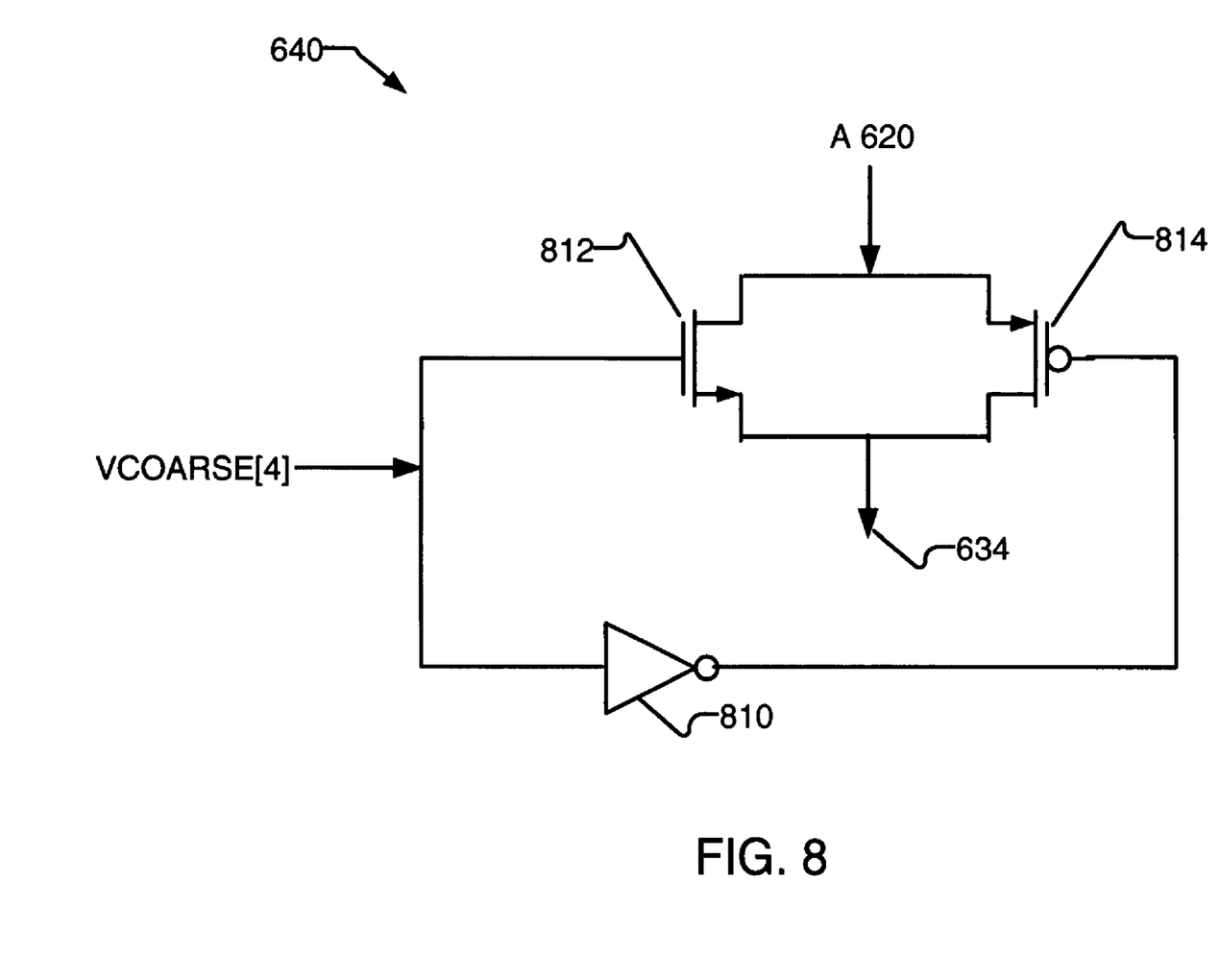
FIG. 8 is a schematic of one transmission gate in FIG. 7.

FIG. 8 is a schematic of one of the transmission gates Tgate4 640 in FIG. 7. All the five Tgates, Tgate4-Tgate0, in FIG. 7 have the same circuit schematic. However their layout sizes differ. Thus only the schematic for Tgate4 640 is shown for illustration. Tgate4 640 includes an n-channel transistor 812 coupled in parallel with a p-channel transistor 814. Both transistors have their input connected to signal line 620 and outputs connected to output 634. The gate of transistor 812 is connected to control signal VCOARSE[4]. The gate of transistor 814 is connected to control signal VCOARSE[4] via inverter 810.

Figure 9A:
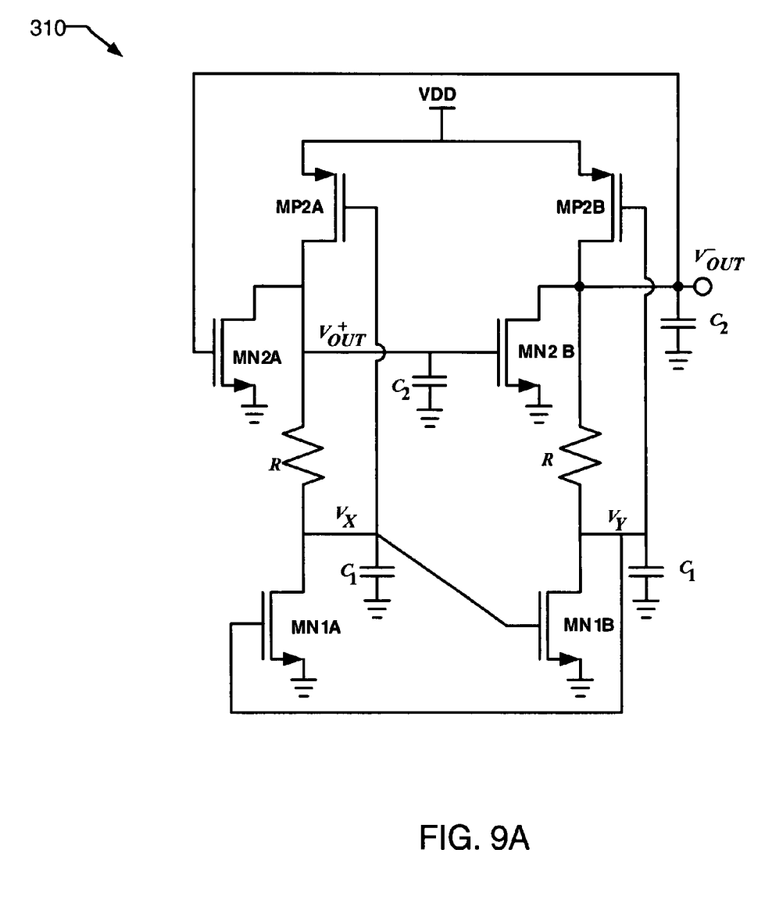
FIG. 9A shows a schematic that allows the determination of the oscillation criteria for the VCO of FIG. 4.
Figure 9B:
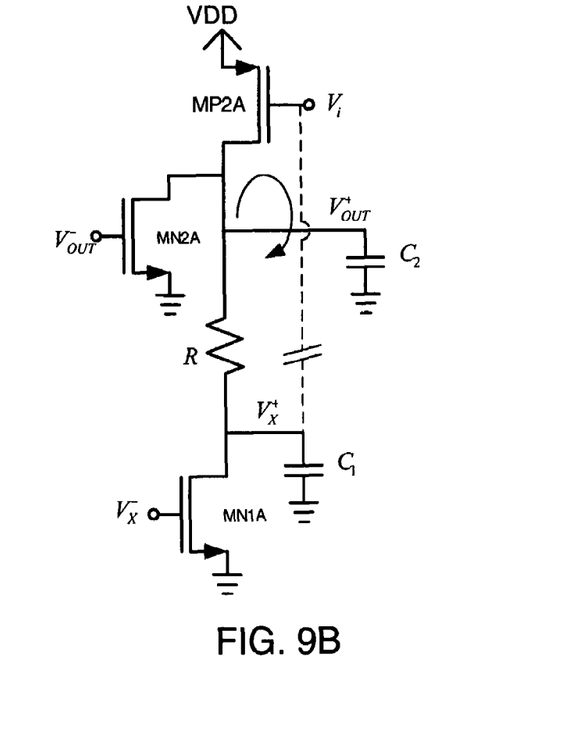
FIG. 9B is the corresponding half circuit equivalent model of the VCO in FIG. 9A.
Figure 9C:
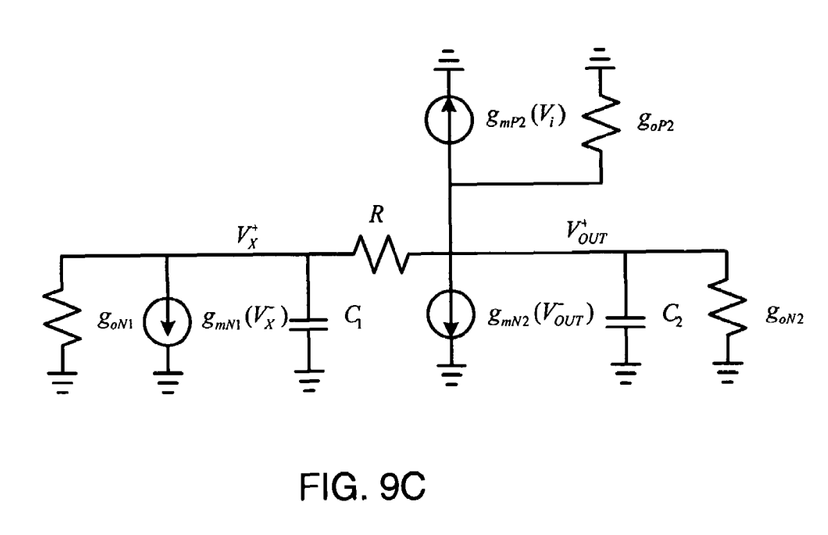
FIG. 9C is the small signal model of the half circuit model in FIG. 9B.

FIG. 9A shows a schematic that allows the determination of the oscillation criteria for the VCO 310 of FIG. 4. The corresponding half circuit equivalent model is shown in FIG. 9B and the small signal model in FIG. 9C. $C_1$ and $C_2$ on FIGS. 9A-9C represent the total capacitance at the respective nodes. Neglecting the Miller capacitances on the transistors ($C_{gd}$ capacitance), the gain transfer function for this circuit can be shown to be:

$$\frac{V_x}{V_i} = \frac{-g_{mP2}R}{s^2 R^2 C_1 C_2 + s[R(C_1 + C_2) - R^2(G_1 C_2 + G_2 C_1)] + R[G_1 G_2 R - (G_1 + G_2)]} \quad (1)$$

Furthermore, in order to obtain a more useful and simplified gain equation, the following two assumptions will be made:

a) First, replace G=G1+G2, and b) Assume $C=C_1=C_2$.

Under the previous two assumptions, the gain transfer function from Equation (1) simplifies to, $$A(s) = \frac{V_x(s)}{V_i(s)} = \frac{g_{mP2}}{RC^2} \left\{ \frac{-1}{s^2 + s\left(\frac{2-RG}{RC}\right) + \frac{G_1 G_2 R - G}{RC^2}} \right\} \quad (2)$$

where:

$C=C_1=C_2$ $G_1 = g_{mN1} - g_{oN1}$ $G_2 = g_{mN2} - g_{oN2} - g_{oP2}$ $G = G_1 + G_2$

Equation (2) can be re-written as, $$A(s) = \frac{V_x(s)}{V_i(s)} = \frac{g_{mP2}}{RC^2} \left\{ \frac{-1}{as^2 + bs + c} \right\} \quad (3)$$

where:

$a = 1$ $b = \frac{2 - RG}{RC}$ $c = \frac{G_1 G_2 R - G}{RC^2}$

Furthermore, Equation (3) can be expressed as, $$A(s) = \frac{V_x(s)}{V_i(s)} = \frac{g_{mP2}}{RC^2} \left\{ \frac{-1}{(s+A)(s+B)} \right\} \quad (4)$$

where:

$c = A \times B$ $b = A + B$

In order to maintain oscillation, the circuit must satisfy the following two oscillation criteria (also known as the Barkhausen oscillation criteria):

The first oscillation criterion is the Phase Condition. The circuit will oscillate at the frequency where the loop phase shift totals 360° (or 0°). The gain transfer function in Equation (4) gets 180° from the DC inversion (− sign in the numerator, which comes from the DC inversion provided by transistor MP2), and the other 180° are provided by the two poles in the denominator. In order for the circuit to oscillate, both A and B must be negative. Since b=A+B, b must also be a negative number. Therefore the Phase condition of oscillation gives, $$b = \frac{2 - RG}{RC} < 0 \quad (5)$$

$$R_{MIN} = \frac{2}{G}$$

which means that the minimum resistance for which the circuit will oscillate ($R_{MIN}$) is equal to 2/G.

The second oscillation criterion is the Amplitude Condition. The total gain through the circuit must be equal to unity for a sustained oscillation. In order for the circuit to sustain oscillation, the gain at the frequency of oscillation ($f_o$) must be equal to 1. From Equation (2) it follows that, $$|A(s)|_{s=j\omega_0} = \left| \frac{g_{mP2}}{RC^2} \left\{ \frac{-1}{(j\omega_0)^2 + (j\omega_0)\left(\frac{2-RG}{RC}\right) + \frac{G_1 G_2 R - G}{RC^2}} \right\} \right| = 1 \quad (6)$$

The VCO 510 of FIG. 6 can replace the VCO in the phase locked loop (PLL) of one or more of the multi-gigabit transceivers (MGTs) in the Virtex Field Programmable Gate Array (FPGA) chip from Xilinx, Inc. of San Jose, Calif.

Although the invention has been described in connection with several embodiments, it is understood that this invention is not limited to the embodiments disclosed, but is capable of various modifications, which would be apparent to one of ordinary skill in the art. For example, while different sized transmission gates are described to set programmable resistance, other programmable resistance circuits can be substituted as known by one of ordinary skill in the arts. As another example, while specific single stage ring oscillators are described, other embodiments include any single stage oscillator with both a coarse digital and a fine analog frequency control. Thus, the invention is limited only by the following claims.

What is claimed is:

1. A voltage controlled oscillator (VCO) comprising:
   a first n-channel latch having a first output and a second output;
   a first P-channel transistor coupled between a voltage supply and a first VCO output, wherein a gate of the first P-channel transistor is coupled to the first output of the first n-channel latch;
   a first programmable resistor circuit coupled between the first VCO output and the first output of the first n-channel latch;
   a second n-channel latch coupled to the first VCO output;
   a second P-channel transistor coupled between the voltage supply and a second VCO output, wherein a gate of the second P-channel transistor is coupled to the second output of the first n-channel latch; and a second programmable resistor circuit coupled between the second VCO output and the second output of the first n-channel latch
wherein the second programmable resistor circuit comprises a plurality of transmission gates controlled by the coarse control input and one or more transistors controlled by the fine voltage control input.

2. The VCO of claim 1 wherein the first and second programmable resistor circuits have a coarse control input and a fine voltage control input.

3. The VCO of claim 1 wherein the first programmable resistor circuit includes a variable resistor.

4. The VCO of claim 1 wherein the plurality of transmission gates have different sizes.

5. The VCO of claim 1 wherein the second n-channel latch comprises two cross-coupled n-channel transistors.

6. The VCO of claim 5 wherein the second n-channel latch is further coupled to the second VCO output.

7. The VCO of claim 6 further comprising a plurality of pull-up p-channel transistors coupled to the voltage supply and controlled by a power down signal, wherein a first transistor of the plurality of pull-up p-channel transistors is further coupled to gate of the first P-channel transistor and a second transistor of the plurality of pull-up p-channel transistors is further coupled to the first VCO output.

8. The VCO of claim 7 further comprising:
a first n-channel transistor controlled by the power down signal and connected between the first n-channel latch and ground; and
a second n-channel transistor controlled by the power down signal and connected between the second n-channel latch and ground.

9. The VCO of claim 1 wherein the first n-channel latch comprises two cross-coupled n-channel transistors.

10. A voltage controlled oscillator (VCO) comprising:
a first latch coupled to a voltage supply and having a first VCO output and a second VCO output;
a first programmable resistor circuit coupled between the first VCO output and a first node, the first programmable resistor circuit receiving a digital control input having one or more bits for coarse setting of a VCO frequency and an analog control input for fine setting of the VCO frequency;
a first transistor coupled between the first node and ground, wherein a gate of the first transistor is coupled to the first VCO output; and
a second latch coupled to the supply voltage and to the first node.

11. The VCO of claim 10 further comprising:
a second programmable resistor circuit coupled between the second VCO output and a second node, wherein the second programmable resistor circuit receives the digital control input and the analog control input; and
a second transistor coupled between the second node and ground, wherein a gate of the second transistor is coupled to the second VCO output.

12. The VCO of claim 10 wherein the analog control input is a differential signal and the first programmable resistor circuit comprises:
a plurality of binary weighted transmissions gates coupled in parallel with a first resistor and controlled by the one or more bits for coarse setting of the VCO frequency;
a second resistor coupled in series with the first resistor; and
a plurality of transistors coupled in parallel with the first resistor and controlled by the differential signal for fine setting of the VCO frequency.

13. The VCO of claim 12 wherein the plurality of transistors are further coupled in parallel with the second resistor.

14. The VCO of claim 12, wherein the plurality of transistors comprise a n-channel transistor coupled in parallel with a p-channel transistor.

15. The VCO of claim 10 wherein the first resistor or the second resistor or both comprise one or more transmissions gates.

16. The VCO of claim 10 wherein the first latch comprises two cross coupled p-channel transistors and the first transistor is a n-channel transistor.

17. A single stage voltage controlled oscillator comprising:
transistor means for providing a 180 degree phase shift, the transistor means coupled to a voltage reference means;
a first latch means for providing a first 90 degrees phase shift;
a second latch means for providing a second 90 degrees phase shift;
a first programmable resistor means for setting a resistance based on a coarse digital setting and a fine analog setting, the first programmable resistor means coupled between the first latch and the second latch and further coupled to the transistor means.

18. The single stage voltage oscillator of claim 17 wherein the voltage reference means is either a voltage supply or ground, and further comprising: power down transistor means for providing a gate to source and gate to bulk voltage.

* * * * *